(12) United States Patent
Yamazaki et al.

(10) Patent No.: US 9,224,980 B2
(45) Date of Patent: Dec. 29, 2015

(54) LIGHT-EMITTING DEVICE

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 85 days.

(21) Appl. No.: 14/227,393

(22) Filed: Mar. 27, 2014

(65) Prior Publication Data

US 2014/0291648 A1    Oct. 2, 2014

(30) Foreign Application Priority Data

Mar. 28, 2013  (JP) .................. 2013-069490

(51) Int. Cl.
*H01L 35/24* (2006.01)
*H01L 51/52* (2006.01)
*H01L 27/32* (2006.01)

(52) U.S. Cl.
CPC .......... *H01L 51/525* (2013.01); *H01L 27/3246* (2013.01)

(58) Field of Classification Search
CPC .................................. H01L 51/5203
USPC ............................................ 257/40, E51.001
See application file for complete search history.

(56) References Cited

U.S. PATENT DOCUMENTS

| 6,781,162 B2 | 8/2004 | Yamazaki et al. |
| 7,399,991 B2 | 7/2008 | Seo et al. |
| 7,663,149 B2 | 2/2010 | Seo et al. |
| 2011/0157252 A1 | 6/2011 | Yamazaki et al. |

FOREIGN PATENT DOCUMENTS

JP     2002-324673 A    11/2002

*Primary Examiner* — Anthony Ho
(74) *Attorney, Agent, or Firm* — Husch Blackwell LLP

(57) ABSTRACT

Provided is a light-emitting device with a high aperture ratio. The light-emitting device includes a first substrate; a first insulating film over the first substrate; a first partition over the first insulating film; a second insulating film which covers the first insulating film and the first partition and which has a concave surface; a first electrode which is over the second insulating film and which has an edge portion at a position overlapping with the first partition; a second partition which is over the first partition and which overlaps with the edge portion of the first electrode; a layer containing a light-emitting organic compound over the first electrode and the second partition; a second electrode over the layer containing a light-emitting organic compound; and a second substrate which is over the second electrode and which overlaps with the first substrate.

28 Claims, 7 Drawing Sheets

LIGHT-EMITTING DEVICE

BACKGROUND OF THE INVENTION

1. Field of the Invention

The present invention relates to an object, a method, or a manufacturing method. Further, the present invention relates to a process, a machine, manufacture, or a composition of matter. In particular, one embodiment of the present invention relates to a semiconductor device, a display device, a light-emitting device, a memory device, an arithmetic device, an imaging device, a driving method thereof, or a manufacturing method thereof.

2. Description of the Related Art

In recent years, self-luminous display devices, light-emitting devices, and the like including light-emitting elements such as electroluminescence (EL) elements in pixels have attracted attention. As examples of such a light-emitting element used in such a self-luminous display device, an organic EL element and an inorganic EL element are known. These light-emitting elements emit light by themselves; thus, the visibility of an image displayed by a display device including the organic EL element or the inorganic EL element is higher than that of an image displayed by a display device including a liquid crystal element. Further, the organic EL element and the inorganic EL element have advantages such as unnecessity of a backlight and high response speed.

An organic EL element has a structure in which a layer containing a light-emitting organic compound (hereinafter referred to as an EL layer) is sandwiched between a pair of electrodes. Light emission can be obtained from the EL layer when voltage is applied between the pair of electrodes. Patent Document 1 discloses an example of a display device including such an organic EL element.

REFERENCE

[Patent Document 1] Japanese Published Patent Application No. 2002-324673

SUMMARY OF THE INVENTION

The thickness of an EL layer formed in a pair of electrodes in an organic EL element is extremely thin and therefore a short-circuit failure may be caused between the pair of electrodes. The failure is likely to occur by poor coverage of a layer containing an organic compound or the like at a step formed at an edge portion of the electrode or the like. Therefore, a structure in which a partition is formed so as to cover the edge portion of the electrode, thereby reducing the influence of the step, is known.

When the edge portion of the electrode is covered with the partition, an effective area of the electrode is reduced, which causes a problem in that an aperture ratio is decreased. In particular, in the case where pixel density is increased in accordance with demands for higher definition or the like, the aperture ratio is significantly decreased.

Thus, one object of one embodiment of the present invention is to provide a light-emitting device with a high aperture ratio. Another object is to provide a light-emitting device with high light extraction efficiency. Another object is to provide a light-emitting device with high light emission intensity. Another object is to provide a light-emitting device with low power consumption. Another object is to provide a light-emitting device with high reliability.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention, which is disclosed in this specification, relates to a structure in which one electrode of a pair of electrodes in a light-emitting element is formed on a surface with curvature or a structure in which the electrode is formed on a flat surface and a surface with curvature.

One embodiment of the present invention is a light-emitting device including a first substrate; a first insulating film over the first substrate; a first partition over the first insulating film; a second insulating film which covers the first insulating film and the first partition and which has a concave surface; a first electrode which is over the second insulating film and which has an edge portion at a position overlapping with the first partition; a second partition which is over the first partition and which covers the edge portion of the first electrode; a layer containing a light-emitting organic compound over the first electrode and the second partition; a second electrode over the layer containing a light-emitting organic compound; and a second substrate which is over the second electrode and which overlaps with the first substrate.

Another embodiment of the present invention is a light-emitting device including a first substrate; a first insulating film over the first substrate; a first partition over the first insulating film; a first electrode which is over the first insulating film and the first partition and which has an edge portion over the first partition; a second partition which is over the first partition and which covers the edge portion of the first electrode; a layer containing a light-emitting organic compound over the first electrode and the second partition; a second electrode over the layer containing a light-emitting organic compound; and a second substrate which is over the second electrode and which overlaps with the first substrate.

It is preferable that the first partition have a curved surface.

Further, a light-transmitting liquid material or a light-transmitting solid material may be included between the second electrode and the second substrate. Furthermore, it is preferable that a refractive index of the liquid material or the solid material be higher than a refractive index of the second electrode.

Further, a spacer may be over the second partition.

Furthermore, the following structure can be employed: the first electrode is a reflective electrode, the second electrode is a light-transmitting electrode, and light emitted from the layer containing a light-emitting organic compound is released outside through the second electrode.

Further, it is preferable that a refractive index of the second partition be lower than a refractive index of the layer containing a light-emitting organic compound.

By application of one embodiment of the present invention, a light-emitting device with a high aperture ratio can be provided. Further, a light-emitting device with high light extraction efficiency can be provided. Furthermore, a light-emitting device with high light emission intensity can be provided. Further, a light-emitting device with low power consumption can be provided. Further, a light-emitting device with high reliability can be provided.

Note that the description of these effects does not disturb the existence of other effects. In one embodiment of the present invention, there is no need to obtain all the effects. Other effects will be apparent from and can be derived from the description of the specification, the drawings, the claims, and the like.

DETAILED DESCRIPTION OF THE INVENTION

Figure 1A:
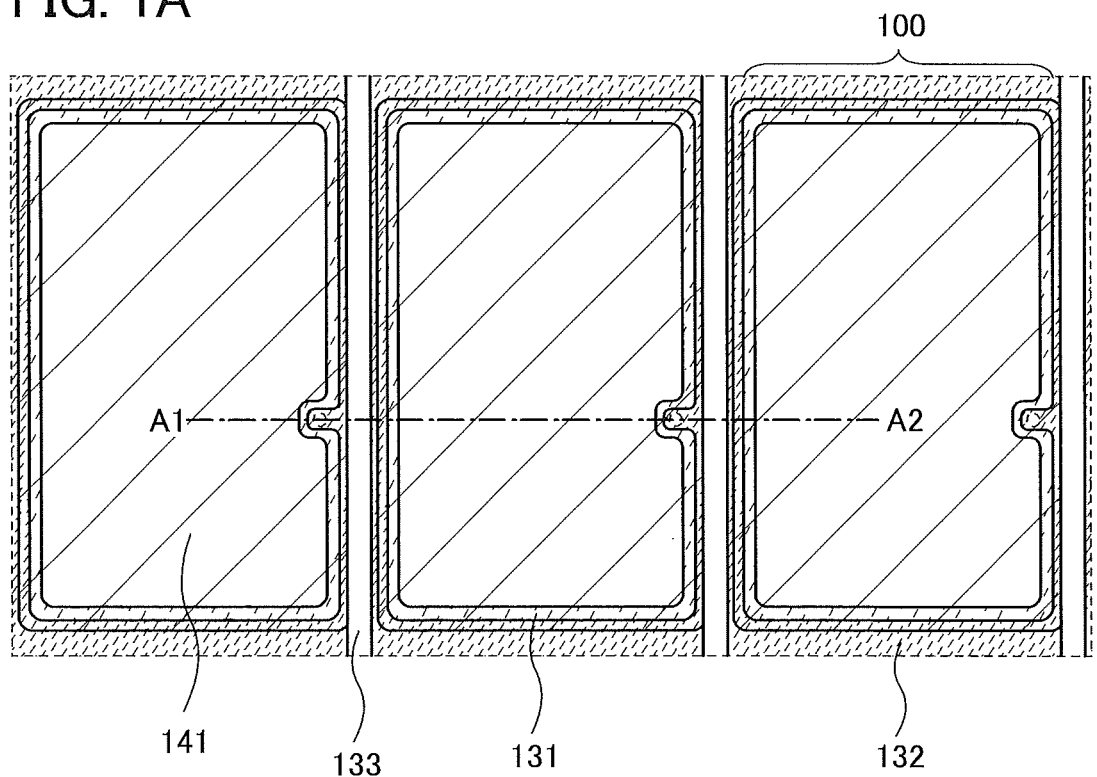
FIG. 1A is a top view and FIG. 1B is a cross-sectional view illustrating a structure of a light-emitting device.

Embodiments are described in detail with reference to drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is not repeated in some cases.

Note that in this specification, an "EL layer" refers to a layer provided between a pair of electrodes in a light-emitting element. Thus, a light-emitting layer that is sandwiched between electrodes and contains a light-emitting organic compound is one embodiment of the EL layer.

Note that a light-emitting device in this specification means an image display device or a light source (including a lighting device. In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

Embodiment 1

In this embodiment, a structure of a light-emitting device of one embodiment of the present invention is described with reference to FIGS. 1A and 1B.

Figure 1B:
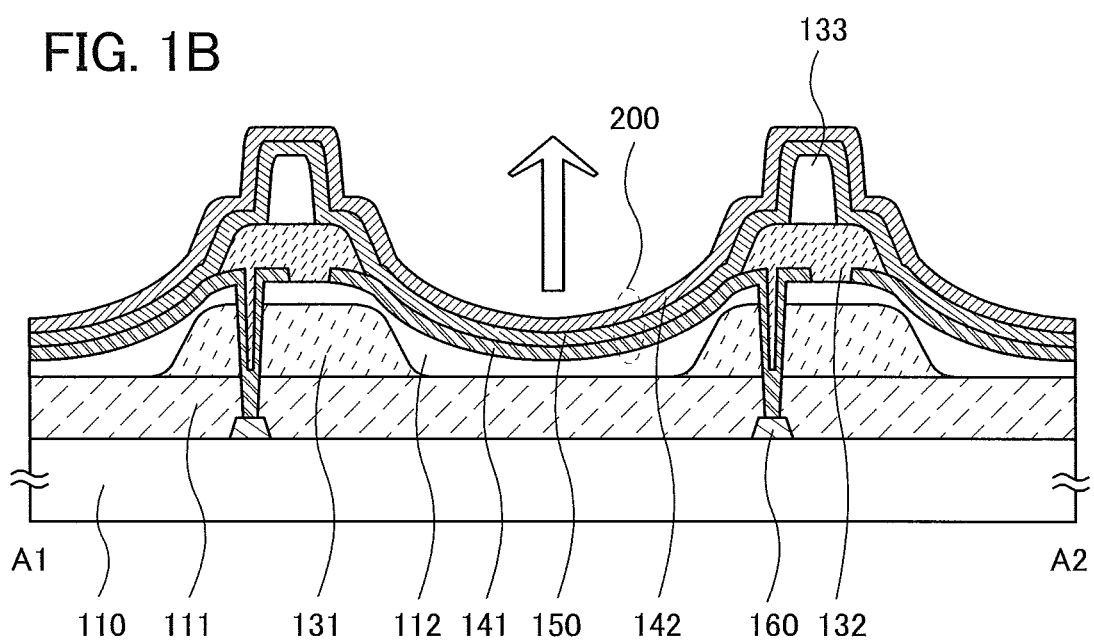

FIG. 1A is a top view of the light-emitting device of one embodiment of the present invention and FIG. 1B is a cross section taken along a dashed-dotted line A1-A2 shown in FIG. 1A. Note that for simplifying the drawing, some components which are formed on the first substrate 110 side are illustrated in FIG. 1A; a transistor, a wiring, and the like are not illustrated. In addition, components such as a substrate opposite to the first substrate 110 and an optical filter formed on the opposite substrate are not illustrated. FIG. 1A illustrates part of the light-emitting device including a plurality of pixels 100 arranged in a matrix.

The light-emitting device of one embodiment of the present invention includes a first insulating film 111 over the first substrate 110, a first partition 131 over the first insulating film 111, a second insulating film 112 over the first insulating film 111 and the first partition 131, a first electrode 141 which is over the second insulating film 112 and which has an edge portion at a position overlapping with the first partition 131, a second partition 132 which is over the first partition 131 and which covers the edge portion of the first electrode 141, a spacer 133 over the second partition 132, an EL layer 150 over the first electrode 141, the second partition 132, and the spacer 133, and a second electrode 142 over the EL layer 150.

In the light-emitting device of one embodiment of the present invention, the spacer 133 is provided between pixels arranged in an A1-A2 direction shown in FIG. 1A and the spacer 133 is not provided between pixels arranged in a direction perpendicular to the A1-A2 direction. With this structure, a decrease in resistance of the second electrode 142 caused by poor coverage with regard to the spacer 133 or the like can be prevented.

Therefore, in a cross section of the pixel 100 in the direction perpendicular to the A1-A2 direction shown in FIG. 1A, the EL layer 150 is provided so as to cover the second partition 132. Note that in the A1-A2 direction, the spacer 133 and the next spacer 133 may be provided with a plurality of pixels provided therebetween. Alternatively, the spacer 133 may be provided in the periphery of a display portion (the outside of the pixels at the endmost position) instead of between pixels.

A transistor and a wiring which are not shown in FIG. 1A are provided over the first substrate 110. For example, a transistor for switching a pixel or a transistor for controlling current to a light-emitting element is provided. Further, a wiring having a function of, for example, a scan line, a signal line, a capacitor line, or a power supply line, is provided.

The first insulating film 111 is provided over the above-described transistor and wiring. The first insulating film 111 is not limited to a single layer, and may have a stacked-layer structure. In order to prevent generation of a short-circuit failure in a light-emitting element 200 including the first electrode 141, the EL layer 150, and the second electrode 142, a top surface of the first insulating film 111 is preferably planarized.

The first partition 131 is provided over the first insulating film 111. The first partition is provided like a bank in the periphery of the pixel 100, and a wiring or the like is provided below the first partition.

Further, the second insulating film 112 is provided so as to cover the first partition 131. The second insulating film is provided to have a concave surface in a region surrounded by the first partition 131.

The first electrode 141 is provided over the second insulating film 112, and an end portion of the first electrode 141 overlaps with the first partition 131. The first electrode is electrically connected to a wiring 160 through an opening provided in the second insulating film 112, the first partition 131, and the first insulating film 111. The wiring 160 can be, for example, a source electrode or a drain electrode of a transistor, or a wiring electrically connected thereto. Note that in the light-emitting element 200, the first electrode 141 serves as a reflective electrode and light is emitted in the direction indicated by an arrow.

Over the first partition 131, the second partition 132 is provided so as to cover the end portion of the first electrode 141 and the opening. The second partition 132 reduces the influence of a step formed by the end portion of the first electrode 141 and the opening.

Further, the spacer 133 is provided over the second partition 132. Furthermore, the EL layer 150 is provided over the first electrode 141, the second partition 132, and the spacer 133, and the second electrode 142 is provided over the EL layer.

Note that the above-described partition and space are formed using an insulating material and they can also be referred to as an insulating layer.

As described above, in the light-emitting device of one embodiment of the present invention, the first electrode 141 of the light-emitting element 200 is provided over the second insulating film 112 having a concave surface. Accordingly, the first electrode 141 has a concave surface; therefore, the substantial area of the light-emitting element can be increased and the emission intensity of the light-emitting device can be increased.

Figure 2A:
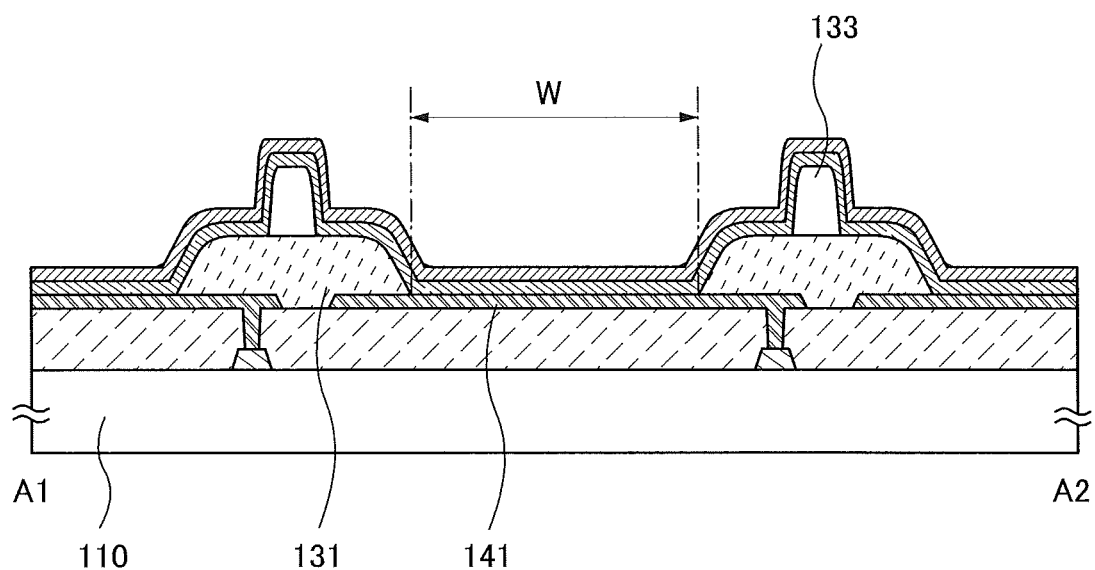
FIGS. 2A and 2B are cross-sectional views each illustrating a structure of a light-emitting device.
Figure 2B:
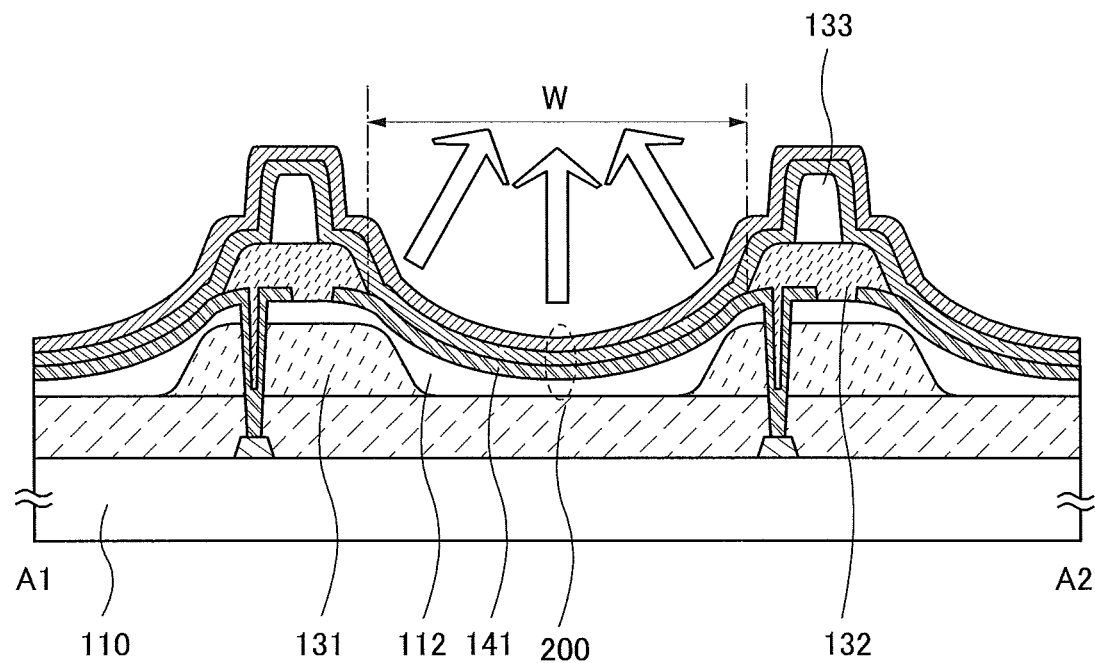

Further, a conventional light-emitting device illustrated in FIG. 2A is compared with the light-emitting device of one embodiment of the present invention illustrated in FIG. 2B. The width of the first partition 131 is the same; however, an effective width (W) of the first electrode 141 is different. That is, in the light-emitting element of one embodiment of the present invention, by utilization of a side surface of the first partition 131, an effective area of the first electrode 141 can be increased and therefore the aperture ratio can be increased.

Further, the light-emitting element 200 of one embodiment of the present invention has a concave surface; therefore, light can be emitted in a wide-angle direction as shown by arrows in FIG. 2B. For example, the amount of light emitted from an opening portion of a pixel provided in the light emission direction can be increased. That is, it can be said that light extraction efficiency can be increased.

Further, since the light extraction efficiency of the light-emitting device can be increased as described above, light emission which is equivalent to that of a conventional light-emitting element can be obtained with a small amount of current. That is, the power consumption of the light-emitting device can be reduced. Further, when the amount of current applied to the light-emitting element is decreased, deterioration of the light-emitting element can be prevented, so that the reliability of the light-emitting device can be increased.

Figure 3:
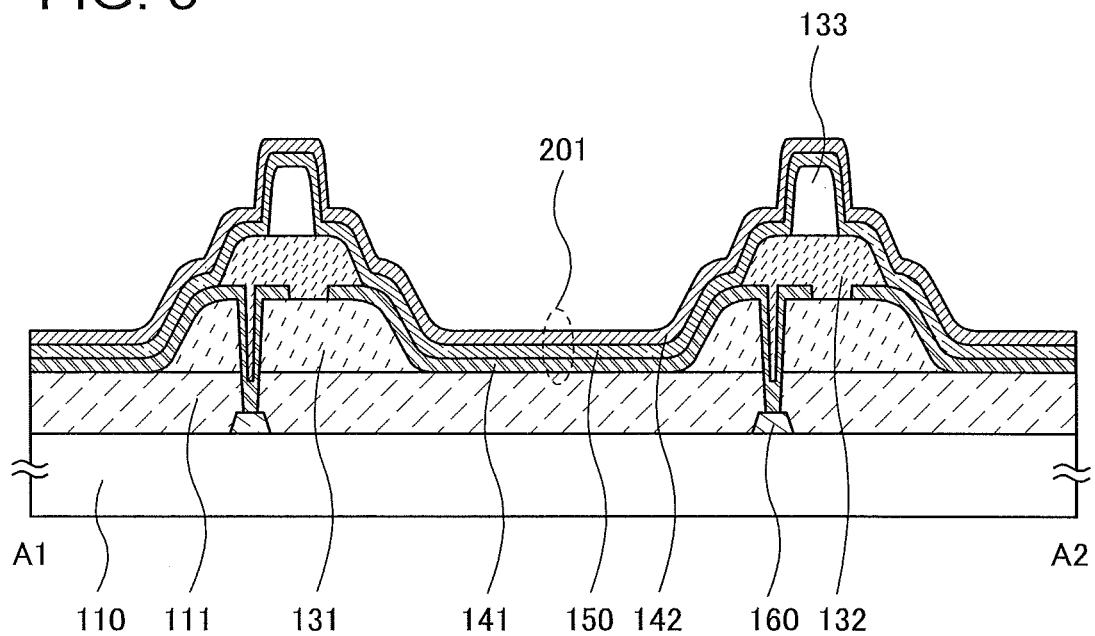
FIG. 3 is a cross-sectional view illustrating a structure of a light-emitting device.

Further, the light-emitting device of one embodiment of the present invention may have a structure of a cross section illustrated in FIG. 3.

A light-emitting device illustrated in FIG. 3 has a structure in which the second insulating film 112 is omitted from the light-emitting device illustrated in FIGS. 1A and 1B, and the other components can be similar to those of the light-emitting device illustrated in FIGS. 1A and 1B.

The first electrode 141 in the light-emitting device illustrated in FIG. 3 is provided in contact with a top surface of the first insulating film 111 and side and top surfaces of the first partition 131. Since a light-emitting element 201 illustrated in FIG. 3 includes a surface with curvature over a boundary region between the first insulating film 111 and the first partition 131, an effect similar to that of the light-emitting device illustrated in FIGS. 1A and 1B can be obtained.

Figure 4:
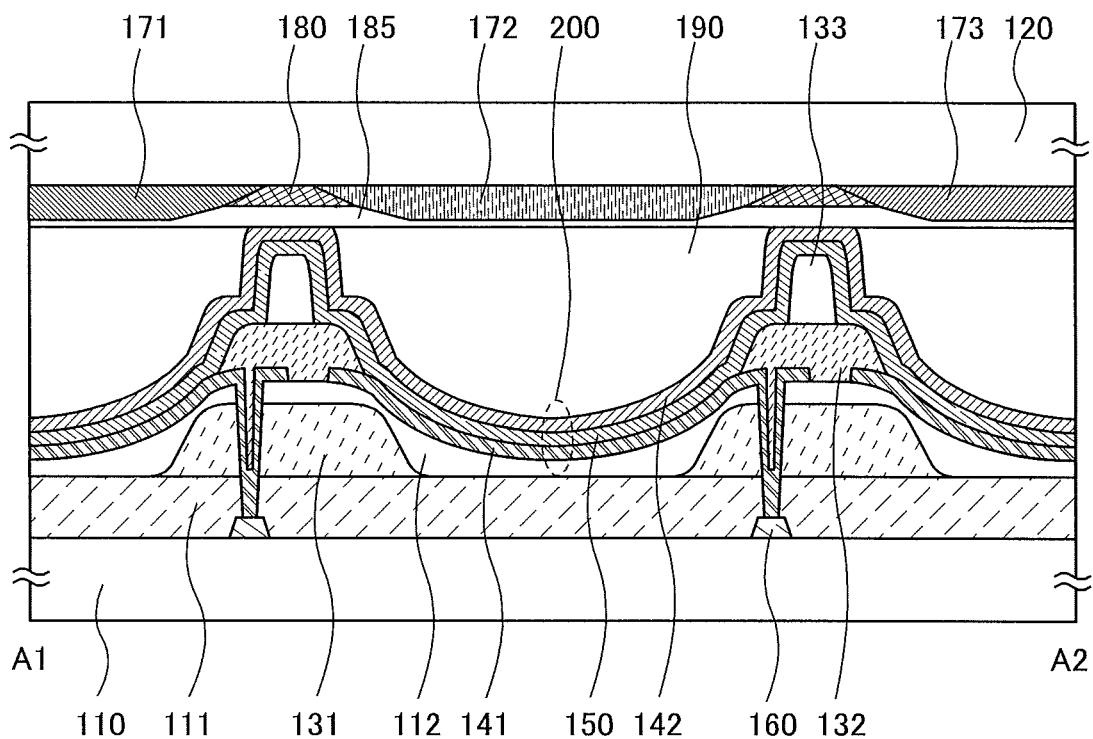
FIG. 4 is a cross-sectional view illustrating a structure of a light-emitting device.

FIG. 4 is a cross-sectional view of a structure in which a second substrate 120 facing the first substrate 110 is bonded to the light-emitting device illustrated in FIGS. 1A and 1B.

The second substrate 120 illustrated as an example is provided with optical filters 171, 172, and 173 so that the optical filters overlap with the first electrode 141. For example, when white light is emitted from the light-emitting element 200, and an optical filter which transmits R (Red) light, an optical filter which transmits G (Green) light, and an optical filter which transmits B (Blue) light are used for the optical filter 171, the optical filter 172, and the optical filter 173, respectively, a light-emitting device for multicolor display can be obtained. Note that a light-blocking layer 180 may be provided so as to overlap with the first partition 131, the second partition 132, or the spacer 133. Further, an overcoat layer 185 may be provided so as to overlap with the optical filters 171, 172, and 173 and the light-blocking layer 180.

Note that, in the case where the light-emitting elements 200 emit R (Red) light, G (Green) light, and B (Blue) light in adjacent pixels, the second substrate 120 is not necessarily provided with an optical filters or the like.

A material having a light-transmitting property may be included in a region 190 where a structure formed on the first substrate 110 side is not in contact with a structure formed on the second substrate 120 side.

As the material having a light-transmitting property, for example, a material that reacts with or adsorbs impurities (typically, water and/or oxygen) which reduce the reliability of the light-emitting element can be used. Accordingly, the impurities preferentially react with or are preferentially adsorbed by the material contained in a filler before reducing the reliability of the light-emitting element and become inactive. Accordingly, the reliability of the light-emitting device can be improved.

As the material having a light-transmitting property, one or more substances selected from a substance having a high hole-transport property, a light-emitting substance, a host material, a substance having a high electron-transport property, a substance having a high electron-injection property, an acceptor substance, and the like can be used.

Specific examples of the material having a light-transmitting property include a conductive high molecule, poly(3,4-ethylenedioxythiophene)/poly(styrenesulfonic acid) (PEDOT/PSS), a dry agent, a material that can be used in the EL layer 150, 4,4'-bis[N-(1-naphthyl)-N-phenylamino]biphenyl (abbreviation: NPB or α-NPD), and tris(8-quinolinolato)aluminum (III) (abbreviation: Alq).

With the material having a light-transmitting property, the second electrode 142 and the second substrate 120 (including a structure formed over the second substrate 120) can be optically connected to each other. Accordingly, a drastic change in the refractive index (also referred to as a step portion in the refractive index) of light emitted from the light-emitting element 200 can be suppressed in a light path from the second electrode 142 to the second substrate 120, whereby light of the light-emitting element 200 can be efficiently extracted to the second substrate 120 through the second electrode 142. Thus, luminous efficiency of the light-emitting device can be improved.

It is preferable that the material having a light-transmitting property be formed using a material having a higher refractive index than the second electrode 142. With the use of such a material, total reflection at an interface between the second electrode 142 and the light-transmitting material is suppressed, so that light can be extracted efficiently.

Note that as the material with which the second electrode 142 and the second substrate 120 can be optically connected to each other, a liquid crystal material, a resin having a light-transmitting property such as a fluorine-based inactive liquid (e.g., perfluorocarbon), or the like can be used other than the above-described materials. These materials may be used after impurities which reduce the reliability of the light-emitting element are removed therefrom as needed. In addition, a material which reacts with or adsorbs the impurities may be dispersed in the above materials.

As examples of the liquid crystal material, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like. Further, a mixed material of any of the above-described liquid crystals and a chiral material or the like can be used.

Next, components of the light-emitting device illustrated in FIG. 4 are described in detail.

A substrate which has heat resistance high enough to withstand a manufacturing process of the light-emitting device can be used as the first substrate 110. The substrate may have a single-layer structure or a layered structure including two or more layers. The first substrate 110 is not particularly limited in thickness and size as long as they can be used in a manufacturing apparatus.

The first substrate 110 preferably has a gas barrier property. Alternatively, a film having a gas barrier property may be stacked over the first substrate 110. Specifically, when a material having a gas barrier property such that the vapor permeability is lower than or equal to $10^{-5}$ g/m$^2$·day, preferably lower than or equal to $10^{-6}$ g/m$^2$·day, is used, the reliability of the light-emitting device can be improved.

The first substrate 110 may have flexibility. As a flexible substrate, a plastic substrate can be typically given as an example. In addition, a thin glass substrate with a thickness of greater than or equal to 50 μm and less than or equal to 500 μm, metal foil, or the like can be used.

For example, as a substrate which can be used as the first substrate 110, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

As the first insulating film 111, for example, one insulating layer selected from a silicon oxide layer, a silicon oxynitride layer, an aluminum oxide layer, an acrylic resin layer, a polyimide resin layer, a benzocyclobutene resin layer, a polyamide resin layer, an epoxy resin layer, a siloxane-based resin layer, an SOG layer, a polysilazane-based SOG layer, and the like, or a layer including any of the insulating layers can be used.

The first insulating film 111 may have a single-layer structure or a layered structure including two or more layers and is not particularly limited in thickness. Further, a top surface of the first insulating film 111 is preferably planarized. When the top surface of the first insulating film 111 is uneven, a surface of the first electrode 141 also becomes uneven, which might cause a short circuit between the first electrode 141 and the second electrode 142.

The first partition 131 can be formed using an insulating material. The first partition 131 may have a single-layer structure or a layered structure including two or more layers and is not particularly limited in thickness. Further, the first partition 131 preferably has a shape including a curved surface. For example, the first partition 131 can have a shape in which adjacent surfaces are connected by a curved surface or can have a semicircular cross-sectional shape.

As the first partition 131, for example, an insulating layer formed using one selected from photopolymer, photosensitive acrylic, photosensitive polyimide, and the like, or an insulating layer containing one selected from these materials can be used.

As a material of the second insulating film 112, a material similar to that of the first partition 131 can be used. Note that by adjustment of the viscosity of the material in film formation, a shape of the second insulating film 112 can be changed. Further, as the second insulating film 112, an inorganic insulating film such as a silicon oxide film which can be formed by a CVD method, a sputtering method, or the like may be used.

As the first electrode 141, for example, a metal selected from molybdenum, titanium, tantalum, tungsten, aluminum, silver, copper, chromium, neodymium, scandium, and the like, or an alloy containing the metal can be used. The first electrode 141 may have a single-layer structure or a layered structure including two or more layers and is not particularly limited in thickness.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. In addition, an alloy containing gold and copper can be used.

The first electrode 141 can be formed using a metal nitride. Specifically, titanium nitride, molybdenum nitride, tungsten nitride, or the like can be used.

Alternatively, the first electrode 141 can be formed using a conductive metal oxide. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Specifically, a layered structure in which a layer containing titanium is stacked over a layer containing an aluminum-nickel-lanthanum alloy can be used. The aluminum-nickel-lanthanum alloy has high reflectivity and can suppress a phenomenon in which an oxide film having high resistance is formed on the surface of the first electrode 141 owing to the layer containing titanium. As a result, loss of intensity of light emitted from the light-emitting element and loss of electric power due to electric resistance can be reduced.

The second partition 132 can be formed using an insulating material. The second partition 132 may have a single-layer structure or a layered structure including two or more layers and is not particularly limited in thickness. Further, the second partition 132 preferably has a shape including a curved surface. For example, the second partition 132 can have a shape in which adjacent surfaces are connected by a curved surface or can have a semicircular cross-sectional shape.

As a material of the second partition 132, a material similar to that of the first partition 131 can be used. It is preferable that the second partition 132 be formed using a material having a lower refractive index than the EL layer 150. When the second partition 132 is formed using such a material, total reflection at an interface between the EL layer 150 and the second partition 132 can be caused; therefore, light which enters the second partition 132 can be reduced and the light extraction efficiency can be increased.

It is preferable that the EL layer 150 include a layer emitting white light. The EL layer 150 may have a single-layer structure or a layered structure including two or more layers.

As the second electrode 142, for example, a metal selected from aluminum, silver, and the like, or an alloy containing the metal can be used. The second electrode 142 may have a single-layer structure or a layered structure including two or more layers.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. In addition, an alloy containing gold and copper can be used.

The second electrode 142 can be formed using a metal nitride. Specific examples of the metal nitride include titanium nitride, molybdenum nitride, and tungsten nitride.

Alternatively, the second electrode 142 can be formed using a conductive metal oxide. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Specifically, for example, an indium tin oxide layer containing silicon oxide can be used over a magnesium-silver alloy layer. Since the work function of the magnesium-silver alloy layer is low, the magnesium-silver alloy layer is excellent in electron-injection property and conductivity, crystallization of the indium tin oxide layer containing silicon oxide can be suppressed, and the transmittance with respect to light emitted from the EL layer is high. As a result, loss of intensity of light emitted from the light-emitting element and loss of electric power due to electric resistance can be reduced.

The optical filters 171, 172, and 173 formed on the second substrate 120 side each include a layer which transmits at least part of light emitted from the EL layer 150. The optical filters may each have a single-layer structure or a layered structure including two or more layers and is not particularly limited in thickness.

For each of the optical filters 171, 172, and 173, for example, an organic material layer containing a coloring material or a multilayer filter can be used. As the organic material layer containing a coloring material, a layer which transmits red light, a layer which transmits green light, or a layer which transmits blue light can be given.

The light-blocking layer 180 prevents light transmitted through the second substrate 120 from entering the light-emitting device. For example, one light-blocking layer selected from a chromium layer, a titanium layer, a nickel layer, a high molecular layer in which carbon black is dispersed, or the like can be used. The light-blocking layer 180 may have a single-layer structure or a layered structure including two or more layers.

The overcoat layer 185 includes a layer for planarizing the surface and preventing diffusion of impurities (such as water and/or oxygen). The overcoat layer 185 may have a single-layer structure or a layered structure including two or more layers. There is no particular limitation on the thickness of the overcoat layer 185.

The overcoat layer 185 prevents surface unevenness caused by the optical filters, prevents diffusion of impurities contained in the optical filter and/or the light-blocking layer to the side provided with the light-emitting element, or has an effect of preventing diffusion of impurities which pass through the optical filter and/or the light-blocking layer to the side provided with the light-emitting element.

For example, an overcoat layer selected from a polyimide layer, an epoxy layer, an acrylic layer, and the like or a material including one of them can be used as the overcoat layer 185.

A substrate similar to the first substrate 110 can be used as the second substrate 120. Note that the first substrate 110 and the second substrate 120 may be formed using different materials.

This embodiment can be combined with any of the other embodiments in this specification as appropriate.

Embodiment 2

A specific structure of an active matrix light-emitting device having the structure of the pixel described in Embodiment 1 is described in this embodiment.

Note that in this embodiment, an active light-emitting device in which a transistor is provided in a pixel is described as an example; however, one embodiment of the present invention is not limited to the active light-emitting device and can also be applied to a passive light-emitting device, a display device, or a lighting device.

Figure 5A:
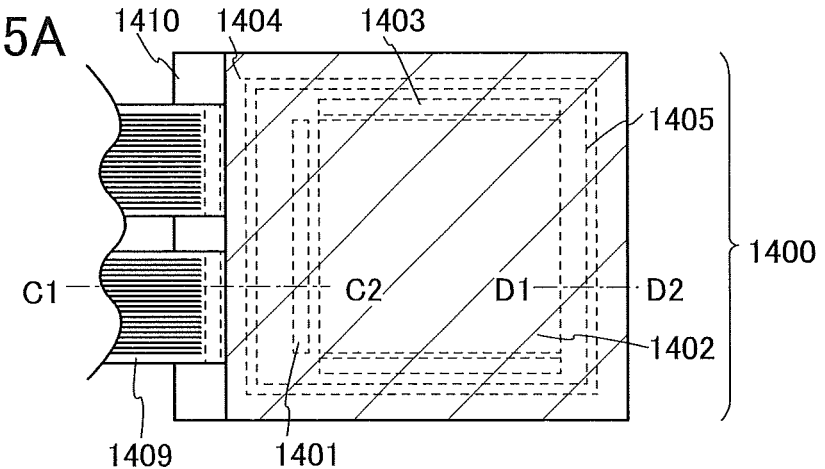
FIG. 5A is a top view and FIGS. 5B and 5C are cross-sectional views each illustrating a structure of a light-emitting device.
Figure 5B:
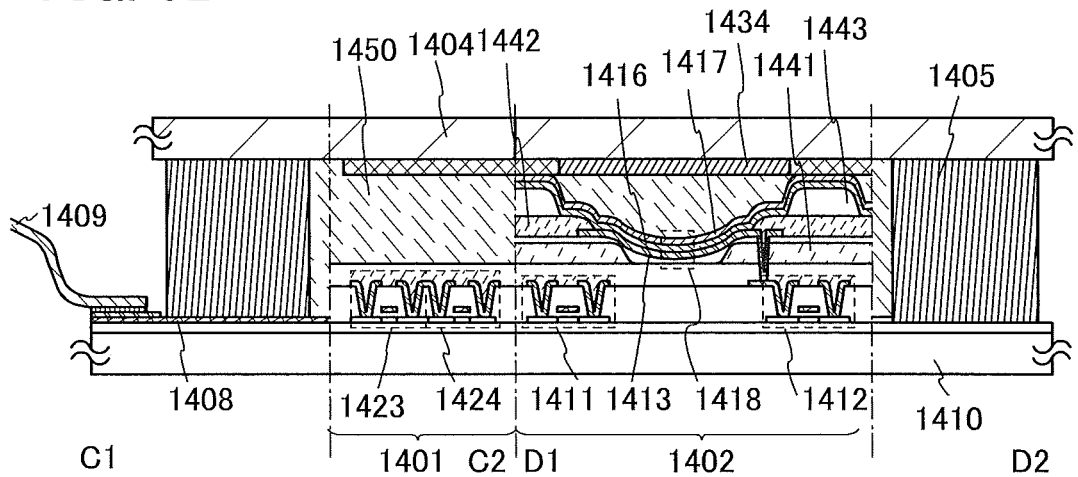
Figure 5C:
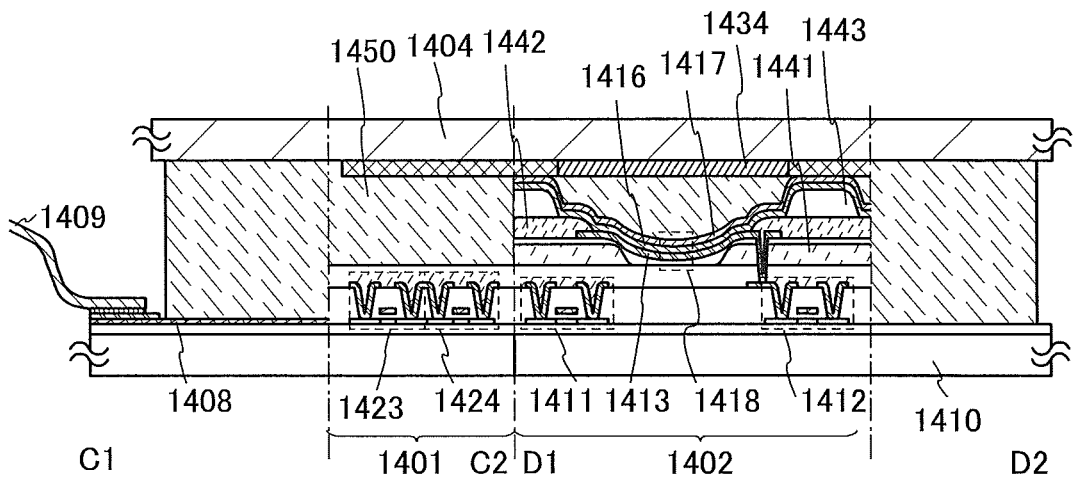

Next, an example of a structure of an active matrix light-emitting device is shown in FIGS. 5A to 5C. Note that FIG. 5A is a top view of the light-emitting device, and FIG. 5B is a cross-sectional view taken along lines C1-C2 and D1-D2 in FIG. 5A.

The active matrix light-emitting device 1400 includes a driver circuit portion (source driver circuit) 1401, a pixel portion 1402, a driver circuit portion (gate driver circuit) 1403, a second substrate 1404, and a sealant 1405 (see FIG. 5A). Note that a portion enclosed by the sealant 1405 is a space.

The light-emitting device 1400 receives a video signal, a clock signal, a start signal, a reset signal, and the like from an FPC (flexible printed circuit) 1409 that is connected to an external input terminal. Note that although only the FPC is illustrated here, the FPC may be provided with a printed wiring board (PWB). The light-emitting device in this specification includes, in its category, not only a light-emitting device itself but also a light-emitting device provided with an FPC or a PWB.

The light-emitting device 1400 includes, over a first substrate 1410, a driver circuit portion including the source driver circuit 1401 and the pixel portion 1402. Further, the light-emitting device 1400 includes a lead wiring 1408 for transmitting signals that are to be input to the source driver circuit 1401 and the gate driver circuit 1403.

Note that although the source driver circuit 1401 includes a CMOS circuit in which an n-channel transistor 1423 and a p-channel transistor 1424 are combined in this embodiment, the driver circuit is not limited to this structure and may be any of a variety of circuits, such as a CMOS circuit, a PMOS circuit, or an NMOS circuit. Although this embodiment describes a driver-integrated type in which the driver circuit is formed over the substrate, the driver circuit may be provided externally.

Note that any of a variety of semiconductor materials can be used for regions where channels of the transistors are formed. Specifically, as well as amorphous silicon, microcrystalline silicon, polycrystalline silicon, or single crystal silicon, an oxide semiconductor or the like can be used.

A transistor including an oxide semiconductor in a channel formation region has very low off-state current. Therefore, the ability to hold a signal input to a pixel (a capacitor) is high, and for example, in still image display or the like, a frame frequency can be lowered. When the frame frequency is lowered, power consumption of the light-emitting device can be reduced.

Although a transistor having a self-aligned top gate structure is shown as an example in FIG. 5B, the transistor may have a channel-etched bottom gate structure, a channel-protective bottom gate structure, or a non-self-aligned top gate structure.

The pixel portion 1402 includes a plurality of pixels. The pixel includes a light-emitting element 1418, a current controlling transistor 1412 whose source electrode is electrically connected to a first electrode 1413 of the light-emitting element 1418, and a switching transistor 1411.

The light-emitting element 1418 includes the first electrode 1413, a second electrode 1417, and an EL layer 1416. Note that the light-emitting element 1418 is provided on a concave surface as described in Embodiment 1.

A first partition 1441, a second partition 1442, and a spacer 1443 can be formed using either a negative photosensitive resin which becomes insoluble in an etchant by light irradiation or a positive photosensitive resin which becomes soluble in an etchant by light irradiation.

The spacer 1443 can prevent damage to the light-emitting element 1418 when external force is applied to a second substrate 1404. Further, the spacer 1443 enables a space between the first substrate 1410 and the second substrate 1404 to be kept constant in a display region, so that display quality can be improved.

In the light-emitting element 1418, it is preferable that a structure for emitting white light be employed for the EL layer 1416.

An optical filter 1434 can be provided so as to overlap with the light-emitting element 1418. In addition, a light-blocking film (also referred to as a black matrix) can be provided to overlap with a partition between adjacent light-emitting elements. Note that the optical filter 1434 and the light-blocking film are provided on the second substrate 1404 side as an example; however, they may be provided on the first substrate 1410 side.

With the first electrode 1413 and the second electrode 1417 of the light-emitting element 1418, a micro resonator (also referred to as microcavity) can be formed. For example, the first electrode 1413 is formed using a conductive film which reflects light emitted from the EL layer 1416, and the second electrode 1417 is formed using a semi-transmissive and semi-reflective conductive film which reflects part of the light and transmits part of the light.

An optical adjustment layer can be provided between the first electrode 1413 and the second electrode 1417. The optical adjustment layer is a layer which adjusts the optical path length between the reflective first electrode 1413 and the semi-transmissive and semi-reflective second electrode 1417. By adjustment of the thickness of the optical adjustment layer, the wavelength of light preferentially extracted from the second electrode 1417 can be adjusted.

The EL layer can be employed for a material that can be used for the optical adjustment layer. For example, the thickness of the optical adjustment layer may be adjusted using a charge generation region. A region containing a substance having a high hole-transport property and an acceptor substance is especially preferably used for the optical adjustment layer, in which case an increase in drive voltage can be inhibited even when the optical adjustment layer is thick.

For another material which can be used for the optical adjustment layer, a light-transmitting conductive film which transmits light emitted from the EL layer 1416 can be used. For example, the light-transmitting conductive film is stacked on a surface of a reflective conductive film; thus, the first electrode 1413 can be formed. Such a structure is preferable because the thickness of an optical adjustment layer of an adjacent first electrode 1413 is easily changed.

The light-emitting device 1400 exemplified in this embodiment has a structure in which the light-emitting element 1418 is sealed in a space enclosed by the first substrate 1410, the second substrate 1404, and the sealant 1405.

A material 1450 having a light-transmitting property may be included in the space. As the material having a light-transmitting property, any of the materials described in Embodiment 1 can be used. Part of the space may remain without being filled with the material having a light-transmitting property. The part of the space which remains may be filled with an inert gas (such as nitrogen or argon) or the sealant 1405. In addition, a material for adsorbing impurities (such as water and/or oxygen), such as a dry agent, may be provided.

The sealant 1405 and the second substrate 1404 are desirably formed using a material which does not transmit impurities in the air (such as water and/or oxygen) as much as possible. An epoxy-based resin, glass frit, or the like can be used for the sealant 1405.

Examples of the second substrate 1404 include a glass substrate; a quartz substrate; a plastic substrate formed of polyvinyl fluoride (PVF), polyester, acrylic, or the like; a substrate of fiber-reinforced plastics (FRP); and the like.

Alternatively, the light-emitting device of one embodiment of the present invention may have a structure of a cross section illustrated in FIG. 5C. In the light-emitting device illustrated in FIG. 5C, the material 1450 having a light-transmitting property of the light-emitting device illustrated in FIG. 5B also serves as the sealant 1405. In this structure, as the material 1450 having a light-transmitting property, a solid resin or the like is preferably used. This structure does not require provision of a sealant; therefore, a highly reliable light-emitting device can be formed easily.

This embodiment can be combined with any of the other embodiments in this specification as appropriate.

Embodiment 3

In this embodiment, a structure of a light-emitting element which can be used for the light-emitting device of one embodiment of the present invention is described. Specifically, an example of a light-emitting element in which an EL layer is provided between a pair of electrodes is described with reference to FIGS. 6A to 6E.

The light-emitting element described in this embodiment as an example includes a lower electrode, an upper electrode, and an EL layer between the lower electrode and the upper electrode. One of the lower and upper electrodes functions as an anode, and the other functions as a cathode. The EL layer is provided between the lower electrode and the upper electrode, and a structure of the EL layer may be appropriately determined in accordance with materials of the lower electrode and the upper electrode. Examples of the structure of the light-emitting element are described below; needless to say, the structure of the light-emitting element is not limited to the examples.

Figure 6A:
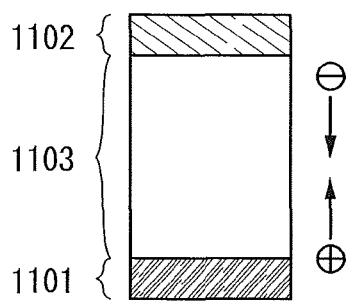
FIGS. 6A to 6E each illustrate a structure of a light-emitting element.

An example of a structure of a light-emitting element is illustrated in FIG. 6A. In the light-emitting element illustrated in FIG. 6A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having a high electron-transport property and a high hole-transport property).

Figure 6B:
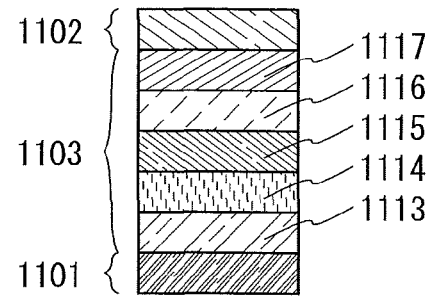

An example of a specific structure of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

Figure 6C:
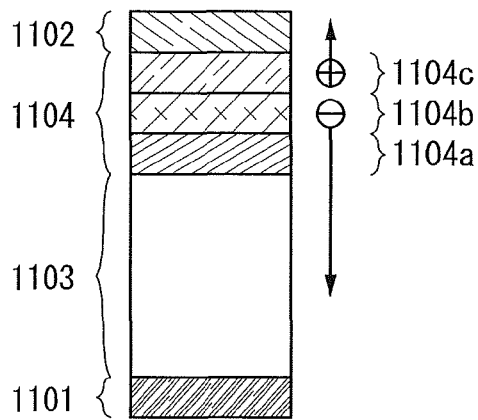

Another example of the structure of the light-emitting element is illustrated in FIG. 6C. In the light-emitting element illustrated in FIG. 6C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behavior of electrons and holes in the intermediate layer 1104 is described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode of the light-emitting element illustrated in FIG. 6C is wider than that of materials that can be used for the cathode of the light-emitting element illustrated in FIG. 6A. This is because a material having a relatively high work function can be used for the cathode of the light-emitting element illustrated in FIG. 6C as long as the cathode can receive holes generated by the intermediate layer.

Figure 6D:
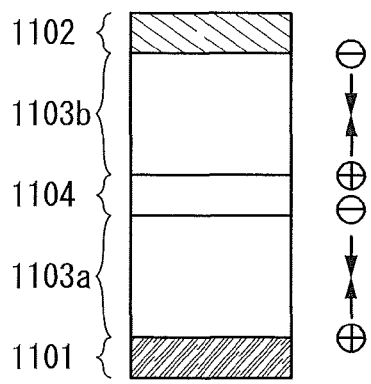

Another example of a structure of a light-emitting element is illustrated in FIG. 6D. In the light-emitting element illustrated in FIG. 6D, an EL layer including two light-emitting units is provided between the anode 1101 and the cathode 1102. Furthermore, the intermediate layer 1104 is provided between a first light-emitting unit 1103a and a second light-emitting unit 1103b.

Figure 6E:
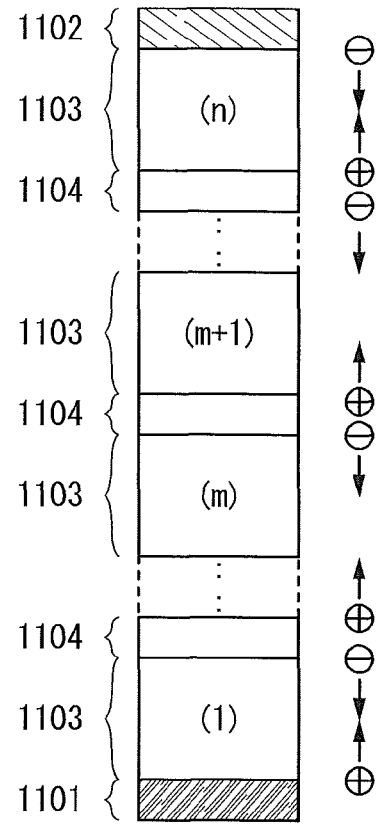

Note that the number of the light-emitting units provided between the anode and the cathode is not limited to two. As illustrated in FIG. 6E as an example, a light-emitting element may have a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (in is a natural number greater than or equal to 1 and less than or equal to n-1) light-emitting unit and an (m+1)-th light-emitting unit.

The structure illustrated in FIG. 6B can be applied to the light-emitting units 1103 of the light-emitting element. The structure of the intermediate layer illustrated in FIGS. 6C and 6D can be applied to the intermediate layers 1104 of the light-emitting element.

The behavior of electrons and holes in the intermediate layer 1104 provided between the light-emitting units is described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

Note that a microresonator (microcavity) composed of a reflective film and a semi-transmissive and semi-reflective film overlapping the reflective film may be placed so as to sandwich a light-emitting element. By placing the light-emitting element between the microresonators, interference of light emitted from the light-emitting element occurs, so that light of a specific color can be efficiently extracted.

Note that the semi-transmissive and semi-reflective film in this specification refers to a film transmitting and reflecting part of incident light. Further, the semi-transmissive and semi-reflective film used for the microresonator preferably absorbs less light.

The wavelength of extracted light depends on the distance between the reflective film and the semi-transmissive and semi-reflective film. An optical adjustment layer for adjusting the distance between the reflective film and the semi-transmissive and semi-reflective film may be provided in the light-emitting element in some cases.

A conductive film having light-transmitting properties to visible light or an EL layer can be employed for a material that can be used for the optical adjustment layer.

For example, a stacked-layer film including a light-transmitting conductive film and a reflective film, or a stacked-layer film including a light-transmitting conductive film and a semi-transmissive and semi-reflective film can be used as a lower electrode or an upper electrode which also serves as the optical adjustment layer.

An interlayer whose thickness is adjusted may be used as the optical adjustment layer. Alternatively, a region whose thickness is adjusted and which contains a substance having a high hole-transport property and an acceptor substance with respect to the substance having a high hole-transport property can be used for the optical adjustment layer. The electric resistance of this component is lower than that of other components included in the EL layer. Thus, even if the thickness is increased for optical adjustment, this structure is preferable because an increase in driving voltage of a light-emitting element can be suppressed.

Next, specific materials that can be used for the light-emitting elements having the above structures are described; materials for the anode, the cathode, and the EL layer are described in this order.

The anode 1101 is formed with a single-layer structure or a stacked structure using any of a metal, an alloy, an electrically conductive compound, and a mixture thereof which have conductivity. In particular, a structure is preferred in which a material having a high work function (specifically, 4.0 eV or higher) is in contact with the EL layer.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), titanium (Ti), and the like, and an alloy thereof.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Specific examples of the oxide of a metal material further include molybdenum oxide, vanadium oxide, ruthenium oxide, tungsten oxide, manganese oxide, titanium oxide, and the like.

A film of the oxide of a metal material is usually formed by a sputtering method, but may be formed by application of a sol-gel method or the like.

Specific examples of the nitride of a metal material include titanium nitride, tantalum nitride, and the like.

Specific examples of the conductive high molecule include poly(3,4-ethylenedioxythiophene)/poly(styrenesulfonic acid) (PEDOT/PSS), polyaniline/poly(styrenesulfonic acid) (PAni/PSS), and the like.

Note that in the case where a second charge generation region is provided in contact with the anode 1101, a variety of conductive materials can be used for the anode 1101 regardless of the size of their work functions. Specifically, besides a material which has a high work function, a material which has a low work function can also be used for the anode 1101.

Materials that can be used for the second charge generation region and the first charge generation region are described later.

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film which transmits visible light and the other is formed using a conductive film which reflects visible light, a light-emitting element which emits light from one side can be formed. Alternatively, when both the cathode 1102 and the anode 1101 are formed using conductive films which transmit visible light, a light-emitting element which emits light from both sides can be formed.

Examples of the conductive film that transmits visible light are a film of indium tin oxide, a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. Further, a metal thin film whose thickness is set so that light is transmitted (preferably, thickness approximately greater than or equal to 5 nm and less than or equal to 30 nm) can also be used.

For the conductive film that reflects visible light, a metal is used, for example. Specific examples include metal materials such as silver, aluminum, platinum, gold, and copper, and an alloy material containing any of these metals. Examples of the alloy containing silver include a silver-neodymium alloy and a magnesium-silver alloy. As examples of the alloy of aluminum, an aluminum-nickel-lanthanum alloy, an aluminum-titanium alloy, and an aluminum-neodymium alloy can be given.

Specific examples of materials for the layers included in the light-emitting unit 1103 are given below.

The hole-injection layer is a layer containing a substance having a high hole-injection property. As the substance having a high hole-injection property, for example, a molybdenum oxide, a vanadium oxide, a ruthenium oxide, a tungsten oxide, a manganese oxide, or the like can be used. Alternatively, the hole-injection layer can be formed with a phthalocyanine compound such as phthalocyanine ($H_2Pc$) or copper phthalocyanine (CuPc), a high molecular compound such as poly(3,4-ethylenedioxythiophene)/poly(styrenesulfonic acid) (PEDOT/PSS), or the like.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region are described later together with materials for forming the first charge generation region.

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ $cm^2/Vs$ or higher is preferably used, in which case the driving voltage of the light-emitting element can be reduced.

As the substance having a high hole-transport property, an aromatic amine compound such as 4,4'-bis[N-(1-naphthyl)-

N-phenylamino]biphenyl (abbreviation: NPB or α-NPD), or a carbazole derivative such as 9-[4-(10-phenyl-9-anthracenyl)phenyl]-9H-carbazole (abbreviation: CzPA) can be given. Further, a high molecular compound (e.g., poly(N-vinylcarbazole) (abbreviation: PVK)), or the like can be used.

The light-emitting layer is a layer containing a light-emitting material. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T) or a phosphorescent compound (e.g., tris(2-phenylpyridinato)iridium(III) (abbreviation: $Ir(ppy)_3$)) can be used.

The light-emitting substance is preferably dispersed in a host material. A host material preferably has higher excitation energy than the light-emitting substance.

As the material which can be used as the host material, the above-described substance having a high hole-transport property (e.g., an aromatic amine compound, a carbazole derivative, and a high molecular compound), a substance having a high electron-transport property (e.g., a metal complex having a quinoline skeleton or a benzoquinoline skeleton and a metal complex having an oxazole-based ligand or a thiazole-based ligand), which will be described later, or the like can be used.

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ $cm^2/Vs$ or higher is preferably used, in which case the driving voltage of the light-emitting element can be reduced.

As the substance having a high electron-transport property, a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: $Zn(BOX)_2$)), or another compound (e.g., bathophenanthroline (abbreviation: BPhen)) can be used. Further, a high molecular compound (e.g., poly[(9,9-dihexylfluorene-2,7-diyl)-co-(pyridine-3,5-diyl)] (abbreviation: PF-Py)) can be used.

The electron-injection layer is a layer containing a substance having a high electron-injection property. The electron-injection layer may have a stacked layer of two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

As the substance having a high electron-injection property, an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), a halide (specifically, lithium fluoride (LiF), cesium fluoride (CsF), or calcium fluoride ($CaF_2$)), or the like can be given.

Alternatively, the layer containing a high electron-injection property may be a layer containing a substance with a high electron-transport property and a donor substance (specifically, a layer made of Alq containing magnesium (Mg)). Note that the mass ratio of the added donor substance to the substance having a high electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

The first charge-generation region 1104c and the second charge-generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, use of a substance having a hole mobility of greater than or equal to $10^{-6}$ $cm^2/Vs$ is preferable. However, besides the above materials, others may be used as long as the material has a higher hole-transport property than an electron-transport property.

The electron-relay layer 1104b is a layer that can immediately receive electrons extracted by the acceptor substance in the first charge generation region 1104c. Hence, the electron-relay layer 1104b is a layer including a substance having a high electron-transport property. Its LUMO level is positioned between the acceptor level of the acceptor substance in the first charge generation region 1104c and the LUMO level of the light-emitting unit 1103 in contact with the electron-relay layer. Specifically, the LUMO level of the electron-relay layer 14b is preferably about greater than or equal to −5.0 eV and less than or equal to −3.0 eV.

As the substance used for the electron-relay layer 1104b, a perylene derivative (e.g., 3,4,9,10-perylenetetracarboxylic dianhydride (abbreviation: PTCDA)), a nitrogen-containing condensed aromatic compound (pyrazino[2,3-f][1,10]phenanthroline-2,3-dicarbonitrile (abbreviation: PPDN)), or the like can be given.

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

An electron-injection buffer is a layer including a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

As the substance having a high electron-injection property, an alkali metal, an alkali earth metal, a rare earth metal, a compound of these metals, or the like can be given.

Further, the layer containing a substance having a high electron-injection property may be a layer containing a substance having a high electron-transport property and a donor substance.

A method for manufacturing the light-emitting element is described. Over the lower electrode, the layers described above are combined as appropriate to form the EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. The upper electrode is formed over the EL layer. In the above manner, the light-emitting element is manufactured.

The light-emitting element described in this embodiment can be manufactured by combining the above materials. Light emission from the above light-emitting material can be obtained with this light-emitting element, and the emission color can be selected by changing the type of the light-emitting material.

Further, when a plurality of light-emitting substances which emit light of different colors are used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Further, in order to obtain white light emission with an excellent color rendering property, an emission spectrum is preferred to spread through the entire visible light region. For example, a light-emitting element may include layers emitting light of blue, green, and red.

This embodiment can be combined with any of the other embodiments in this specification as appropriate.

Embodiment 4

Electronic devices in which the light-emitting device of one embodiment of the present invention can be provided are described in this embodiment.

Examples of the electronic device to which the light-emitting device is applied include television devices (also referred to as TV or television receivers), monitors for computers and the like, cameras such as digital cameras and digital video cameras, digital photo frames, cellular phones (also referred to as mobile phones or portable telephone devices), portable game machines, portable information terminals, audio reproducing devices, large game machines such as pin-ball machines, and the like. Specific examples of these electronic devices are illustrated in FIGS. 7A to 7F.

Figure 7A:
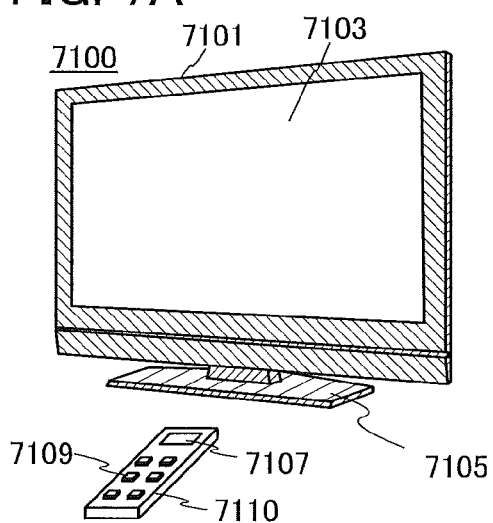
FIGS. 7A to 7F each illustrate an example of an electronic device.

FIG. 7A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 7B:
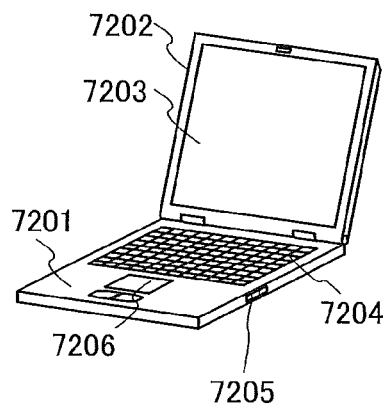

FIG. 7B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 7C:
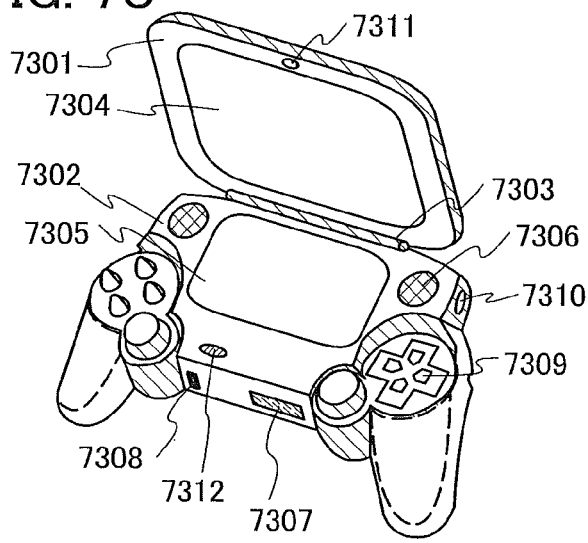

FIG. 7C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 7C has a function of reading out a program or data stored in a storage medium to display it on the display portion, and a function of sharing information with another portable game machine by wireless communication. The portable game machine in FIG. 7C can have a variety of functions without limitation to the above functions.

Figure 7D:
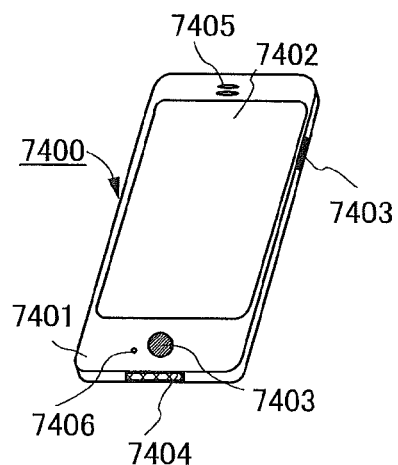

FIG. 7D illustrates an example of a cellular phone. A cellular phone 7400 is provided with a display portion 7402 incorporated in a housing 7401, an operation button 7403, an external connection port 7404, a speaker 7405, a microphone 7406, and the like. Note that the cellular phone 7400 is manufactured using the light-emitting device for the display portion 7402.

When the display portion 7402 of the cellular phone 7400 illustrated in FIG. 7D is touched with a finger or the like, data can be input into the cellular phone. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 7E:
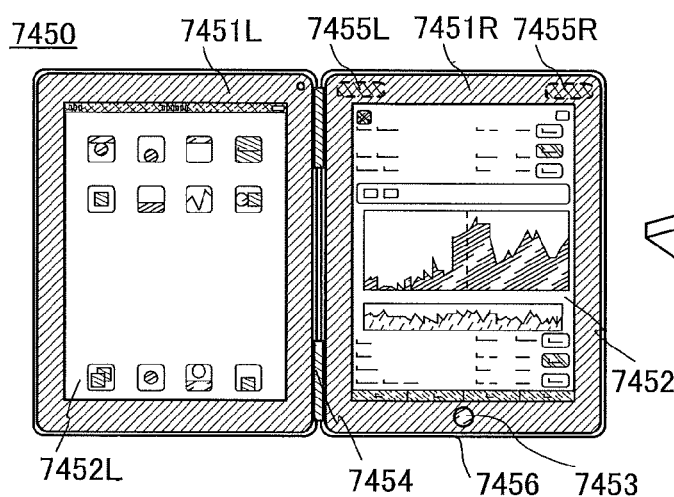

FIG. 7E illustrates an example of a folding computer. A folding computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, display on the screen can be automatically changed by determining the orientation of the flat computer 7450 (whether the computer is placed horizontally or vertically for a landscape mode or a portrait mode).

Furthermore, the computer 7450 can be connected to a network. The computer 7450 not only can display data on the Internet but also can be used as a terminal which controls another electronic device connected to the network from a distant place.

Figure 7F:
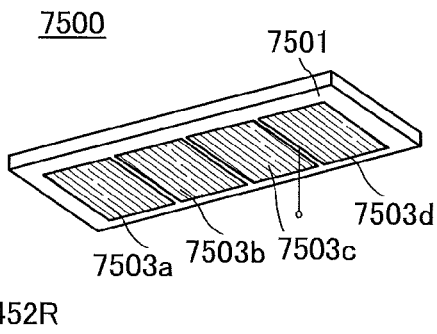

FIG. 7F illustrates an example of a lighting device. In a lighting device 7500, light-emitting devices 7503a, 7503b, 7503c, and 7503d of one embodiment of the present invention are incorporated in a housing 7501 as light sources. The lighting device 7500 can be attached to a ceiling, a wall, or the like.

This embodiment can be combined with any of the other embodiments in this specification as appropriate.

This application is based on Japanese Patent Application serial no. 2013-069490 filed with Japan Patent Office on Mar. 28, 2013, the entire contents of which are hereby incorporated by reference.

What is claimed is:

1. A light-emitting device comprising:
a first substrate;
a first insulating film over the first substrate;
a first partition over the first insulating film;
a second insulating film over the first insulating film and the first partition, the second insulating film including a concave surface;
a first electrode over the second insulating film, an edge portion of the first electrode overlapping with the first partition;
a second partition over the first partition, the second partition overlapping with the edge portion of the first electrode;
a layer containing a light-emitting organic compound over the first electrode and the second partition; and
a second electrode over the layer containing the light-emitting organic compound.

2. The light-emitting device according to claim 1, wherein the first partition has a curved surface.

3. The light-emitting device according to claim 1, further comprising:
a second substrate over the first substrate and the second electrode; and
a light-transmitting liquid material between the second electrode and the second substrate.

4. The light-emitting device according to claim 3, wherein a refractive index of the light-transmitting liquid material is higher than a refractive index of the second electrode.

5. The light-emitting device according to claim 1, further comprising:
a second substrate over the first substrate and the second electrode; and
a light-transmitting solid material between the second electrode and the second substrate.

6. The light-emitting device according to claim 5, wherein a refractive index of the light-transmitting solid material is higher than a refractive index of the second electrode.

7. The light-emitting device according to claim 1, further comprising a spacer over the second partition.

8. The light-emitting device according to claim 1, wherein the first electrode is a reflective electrode, the second electrode is a light-transmitting electrode, and light emitted from the layer containing the light-emitting organic compound is released outside through the second electrode.

9. The light-emitting device according to claim 1, wherein a refractive index of the second partition is lower than a refractive index of the layer containing the light-emitting organic compound.

10. A light-emitting device comprising:
   a first substrate;
   a first insulating film over the first substrate;
   a first partition over the first insulating film;
   a first electrode over the first insulating film and the first partition, an edge portion of the first electrode overlapping with the first partition;
   a second partition over the first partition, the second partition overlapping with the edge portion of the first electrode;
   a layer containing a light-emitting organic compound over the first electrode and the second partition; and
   a second electrode over the layer containing the light-emitting organic compound.

11. The light-emitting device according to claim 10, wherein the first partition has a curved surface.

12. The light-emitting device according to claim 10, further comprising:
   a second substrate over the first substrate and the second electrode; and
   a light-transmitting liquid material between the second electrode and the second substrate.

13. The light-emitting device according to claim 12, wherein a refractive index of the light-transmitting liquid material is higher than a refractive index of the second electrode.

14. The light-emitting device according to claim 10, further comprising:
   a second substrate over the first substrate and the second electrode; and
   a light-transmitting solid material between the second electrode and the second substrate.

15. The light-emitting device according to claim 14, wherein a refractive index of the light-transmitting solid material is higher than a refractive index of the second electrode.

16. The light-emitting device according to claim 10, further comprising a spacer over the second partition.

17. The light-emitting device according to claim 10, wherein the first electrode is a reflective electrode, the second electrode is a light-transmitting electrode, and light emitted from the layer containing the light-emitting organic compound is released outside through the second electrode.

18. The light-emitting device according to claim 10, wherein a refractive index of the second partition is lower than a refractive index of the layer containing the light-emitting organic compound.

19. A light-emitting device comprising:
   a first substrate;
   a first insulating film over the first substrate;
   a pair of first partitions over the first insulating film;
   a first electrode over the first insulating film, edge portions of the first electrode overlapping with the pair of first partitions;
   a pair of second partitions over the pair of first partitions, respectively, the pair of second partitions overlapping with edge portions of the first electrode;
   a layer containing a light-emitting organic compound over the pair of first partitions and the pair of second partitions; and
   a second electrode over the layer containing the light-emitting organic compound.

20. The light-emitting device according to claim 19, further comprising a second insulating film over the first insulating film and the pair of first partitions, the second insulating film including a concave surface between the pair of first partitions.

21. The light-emitting device according to claim 19, further comprising a second substrate over the first substrate and the second electrode, the second substrate having an optical filter and a light-blocking film,
   wherein the light-blocking film overlaps with the first and second partitions.

22. The light-emitting device according to claim 21, further comprising a light-transmitting liquid material between the second electrode and the second substrate.

23. The light-emitting device according to claim 22, wherein a refractive index of the light-transmitting liquid material is higher than a refractive index of the second electrode.

24. The light-emitting device according to claim 21, further comprising a light-transmitting solid material between the second electrode and the second substrate.

25. The light-emitting device according to claim 24, wherein a refractive index of the light-transmitting solid material is higher than a refractive index of the second electrode.

26. The light-emitting device according to claim 19, further comprising a spacer over each of the pair of second partitions.

27. The light-emitting device according to claim 19, wherein the first electrode is a reflective electrode, the second electrode is a light-transmitting electrode, and light emitted from the layer containing the light-emitting organic compound is released outside through the second electrode.

28. The light-emitting device according to claim 19, wherein a refractive index of each of the pair of second partitions is lower than a refractive index of the layer containing the light-emitting organic compound.

* * * * *